(12) United States Patent
MacKinnon

(10) Patent No.: US 11,683,455 B2
(45) Date of Patent: Jun. 20, 2023

(54) IMAGE SENSOR WITH OPTICAL COMMUNICATION CAPABILITIES

(71) Applicant: Apple Inc., Cupertino, CA (US)

(72) Inventor: Neil MacKinnon, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/163,104

(22) Filed: Jan. 29, 2021

(65) Prior Publication Data

US 2021/0152789 A1 May 20, 2021

Related U.S. Application Data

(63) Continuation of application No. 16/009,079, filed on Jun. 14, 2018, now Pat. No. 10,911,727.

(Continued)

(51) Int. Cl.
*H04N 7/22* (2006.01)
*H04B 10/80* (2013.01)
(Continued)

(52) U.S. Cl.
CPC .............. *H04N 7/22* (2013.01); *H01S 5/021* (2013.01); *H01S 5/343* (2013.01); *H01S 5/423* (2013.01);
(Continued)

(58) Field of Classification Search
CPC ...... H04N 7/22; H04N 5/2253; H04N 5/2254; H04N 5/23227; H04N 5/23254;
(Continued)

(56) References Cited

U.S. PATENT DOCUMENTS 6,376,329 B1 6/2002 Sogard et al.
10,321,826 B2 6/2019 Won
(Continued)

FOREIGN PATENT DOCUMENTS

CN 101320139 12/2008
CN 101872043 A 10/2010
(Continued)

OTHER PUBLICATIONS

Office action from Chinese Application No. 201880039351.X, dated Apr. 2, 2021, (English Translation and Chinese Version), pp. 1-16.
(Continued)

*Primary Examiner* — Sinh Tran
*Assistant Examiner* — Zhenzhen Wu
(74) *Attorney, Agent, or Firm* — Alexander A. Knapp; Kowert, Hood, Munyon, Rankin & Goetzel, P.C.

(57) ABSTRACT

A mobile device includes an image sensor separated from a processing component by an open space. The image sensor includes one or more light source modules and the processing component includes one or more light sensors aligned with the one or more light source modules. Image data from the image sensor may be transmitted to the processing component via light signals exchanged between the one or more light source modules and the one or more light sensors. In some embodiments, light signals transmitted between one or more light source modules of an image sensor and one or more light sensors of the processing component are used to determine positional and angular data about the image sensor.

20 Claims, 10 Drawing Sheets

Related U.S. Application Data

(60) Provisional application No. 62/521,210, filed on Jun. 16, 2017.

(51) Int. Cl.

| | | |
|---|---|---|
| *H01S 5/42* | (2006.01) | |
| *H04N 23/54* | (2023.01) | |
| *H04N 23/55* | (2023.01) | |
| *H04N 23/60* | (2023.01) | |
| *H04N 23/68* | (2023.01) | |
| *H04N 25/709* | (2023.01) | |
| *H01S 5/02* | (2006.01) | |
| *H01S 5/343* | (2006.01) | |
| *H04N 7/015* | (2006.01) | |
| *H04B 10/112* | (2013.01) | |
| *H04B 10/25* | (2013.01) | |

(52) U.S. Cl.
CPC ........... *H04B 10/801* (2013.01); *H04N 7/015* (2013.01); *H04N 23/54* (2023.01); *H04N 23/55* (2023.01); *H04N 23/665* (2023.01); *H04N 23/687* (2023.01); *H04N 23/6811* (2023.01); *H04N 25/709* (2023.01); *H04B 10/1121* (2013.01); *H04B 10/25* (2013.01); *H04B 10/807* (2013.01)

(58) Field of Classification Search
CPC .. H04N 5/23287; H04N 5/3698; H04N 7/015; H01S 5/021; H01S 5/343; H01S 5/423; H04B 10/801; H04B 10/1121; H04B 10/25; H04B 10/807

See application file for complete search history.

(56) References Cited

U.S. PATENT DOCUMENTS

| | | | |
|---|---|---|---|
| 10,911,727 B2 | 2/2021 | MacKinnon | |
| 2006/0092285 A1 | 5/2006 | Shin | |
| 2007/0153861 A1 | 7/2007 | Collins et al. | |
| 2010/0091128 A1* | 4/2010 | Ogasawara | H04N 5/3742 348/222.1 |
| 2010/0119236 A1 | 5/2010 | Uno et al. | |
| 2010/0265349 A1* | 10/2010 | Kim | G02B 6/43 348/222.1 |
| 2011/0038282 A1* | 2/2011 | Mihota | H04B 3/52 455/500 |
| 2013/0022063 A1* | 1/2013 | Kumei | H01S 5/18355 372/24 |
| 2013/0122617 A1 | 5/2013 | Lott et al. | |
| 2014/0079088 A1 | 3/2014 | Joseph | |
| 2014/0293124 A1 | 10/2014 | Chen | |
| 2015/0063396 A1 | 3/2015 | Jikutani et al. | |
| 2016/0072258 A1* | 3/2016 | Seurin | H04N 13/204 348/46 |
| 2016/0305774 A1 | 10/2016 | Ross, Jr. et al. | |
| 2016/0327785 A1 | 11/2016 | Truscott et al. | |
| 2017/0025815 A1* | 1/2017 | Jiang | H01S 5/423 |
| 2017/0289457 A1* | 10/2017 | Hu | H02K 33/02 |
| 2018/0007252 A1 | 1/2018 | Tuulos et al. | |
| 2019/0141248 A1* | 5/2019 | Hubert | H04N 5/23287 |
| 2019/0207431 A1 | 7/2019 | Youn et al. | |

FOREIGN PATENT DOCUMENTS

| | | |
|---|---|---|
| CN | 101997560 | 3/2011 |
| CN | 102589445 A | 7/2012 |
| CN | 102714693 A | 10/2012 |
| CN | 203838720 | 9/2014 |
| CN | 105899870 | 8/2016 |
| CN | 206096729 | 4/2017 |
| EP | 2166680 | 3/2010 |
| EP | 2296291 | 3/2011 |
| JP | 2005149127 A | 6/2005 |
| JP | 2010225755 A * | 10/2010 |

OTHER PUBLICATIONS

Notice of Allowance in Chinese Patent Application No. 201880039351.X dated Jul. 21, 2021, Apple Inc., pp. 1-6 including translation of notice.

Office Action from Chinese Patent Application No. 202111147626.1, dated Nov. 18, 2022, pp. 1-10.

* cited by examiner

IMAGE SENSOR WITH OPTICAL COMMUNICATION CAPABILITIES

This application is a continuation of U.S. patent application Ser. No. 16/009,079, filed Jun. 14, 2018, which claims benefit of priority to U.S. Provisional Patent Application Ser. No. 62/521,210 filed on Jun. 16, 2017, which are hereby incorporated by reference herein their entirety.

BACKGROUND

Technical Field

This disclosure relates generally to light signals being sent between a camera image sensor and other camera components.

Description of the Related Art

The advent of small, mobile multipurpose devices such as smartphones and tablet or pad devices has resulted in a need for high-resolution, small form factor cameras for integration in the devices. Also, increasing image quality capabilities of cameras has resulted in a need to communicate large quantities of image data from a camera image sensor to other device components. Some small form factor cameras may use electrical traces or other electrical communication paths to transfer image data from an image sensor. In such arrangements, electromagnetic fields induced by electrical communications may interfere with each other, thus limiting an ability to communicate image data from an image sensor. To avoid such interference, electrical communication paths may be spaced apart from each other, however this may limit a level of density of camera components that can be achieved in a small form factor camera. Also, some small form factor cameras may use magnetic sensors, such as Hall Effect sensors, to determine a position of one or more internal camera components relative to one or more other camera components, such as a position of a lens component relative to an image sensor component. However, such sensors may require a moving magnetic field in order to function properly, thus the sensors are often positioned in a magnetic field of a magnet that moves with an actuator. Such placement requirements may limit where and how such sensors can be placed in a camera. Also, Hall sensors may exhibit offset drift, which may further vary with temperature changes, and may require repeated re-calibration.

SUMMARY OF EMBODIMENTS

In some embodiments, light signals are used to transmit large amounts of image data between an image sensor of a camera and other camera components that are densely packed in a thin form factor mobile device. For example, a system, such as a mobile device, includes a casing, an image sensor positioned in an interior space of the casing, an electrical backplane positioned in the interior space of the casing. In some embodiments, the system includes an open space between the image sensor and the electrical back plane. In some embodiments, the open space may be partially filled with other components, such as a lens or lens system. In some embodiments, the backplane may be integrated into or attached to the casing. The electrical backplane may include processors, memory devices, and other components that perform various functions for the camera and/or the mobile device. In some embodiments, the electrical backplane may be a circuit board assembly or may be coupled with one or more circuit board assemblies. The image sensor includes an image capture portion and one or more light source modules located on a portion of the image sensor other than the image capture portion. The electrical backplane on the other side of the open space from the image sensor includes one or more light sensors configured to detect light emitted from the one or more light source modules of the image sensor. In some embodiments, the one or more light source modules may communicate image data from the image sensor via emitted light passing through the open space to the one or more light sensors of the electrical backplane. Also, in some embodiments, emitted light from the one or more light source modules of the image sensor may be detected by the one or more light sensors of the electrical backplane and may be used to determine a relative position and/or angle of the image sensor relative to the electrical backplane. In some embodiments, the system may further include actuators coupled to the image sensor configured to adjust a position and/or angle of the image sensor. In some embodiments, large quantities of image data, for example image data for high-definition videos, may be passed between the image sensor and the electrical backplane using light signals emitted from the one or more light sources of the image sensor and detected by the one or more light sensors of the electrical backplane.

In some embodiments, a system includes an image sensor comprising an image capture portion and one or more light source modules located in one or more locations on the image sensor other than the image capture portion. The one or more light source modules may be semi-conductor lasers configured to emit light from the image sensor through an open space adjacent to the image sensor. For example, the one or more light source modules may emit light through an open space to one or more light sensors to communicate image data and or determine a relative position or relative angle of the image sensor.

In some embodiments, a method includes transmitting, from an image sensor, a light signal to an electrical backplane, wherein the image sensor and the electrical backplane are positioned in an interior space of a mobile device. The method further includes receiving, by a light sensor, the light signal from the image sensor and determining, by a processor of the electrical backplane, image data for an image captured by the image sensor based on the received light signal.

In some embodiments, various mitigation schemes may be employed to shield an image capture portion of an image sensor from being affected by stray light being emitted by a light source module or from being affected by stray light at a light sensor. For example, the image capture portion of the image sensor may be located on an opposite side of the image sensor from an open space through which light from a light source module is emitted. Also, in some embodiments, baffling may be included with a light source module to prevent light emitted from the light source module from propagating in directions that may affect the image capture portion of the image sensor. For example, baffling may be included around an edge of a light source module to prevent propagation of stray light as light is emitted from the light source module. Also, baffling may be included in a silicon structure of an image sensor to prevent light from being conducted through the silicon structure of the image sensor and affecting an image capture portion of the image sensor. In some embodiments, baffling within a silicon structure of an image sensor may prevent stray light from a light source module from affecting an image capture portion of the image sensor. Also, baffling may be included in a silicon structure of an image sensor to prevent light being receive at a light sensor from affecting an image capture portion of the image sensor, wherein the light sensor is located on a portion of the image sensor other than the image capture portion. Also, in some embodiments, light source modules may emit light at wavelengths at which silicon has minimal or no response. For example, in some embodiments light source modules may comprise Indium Phosphide Vertical Cavity Surface Emitting Lasers (VCSELs) operating at wavelengths in the range of 1550 nanometers. In some embodiments, light source modules may emit light at infrared wavelengths, and an image sensor may include an infrared filter that filters stray infrared light from affecting images captured by the image sensor. Additionally, the interior portion of the casing may include a light absorbent coating designed to absorb light emitted by the light sources, such that stray light reflected within the casing is at least partially absorbed by the absorbent coating to eliminate or reduce stray light within the casing.

Figure 1A:
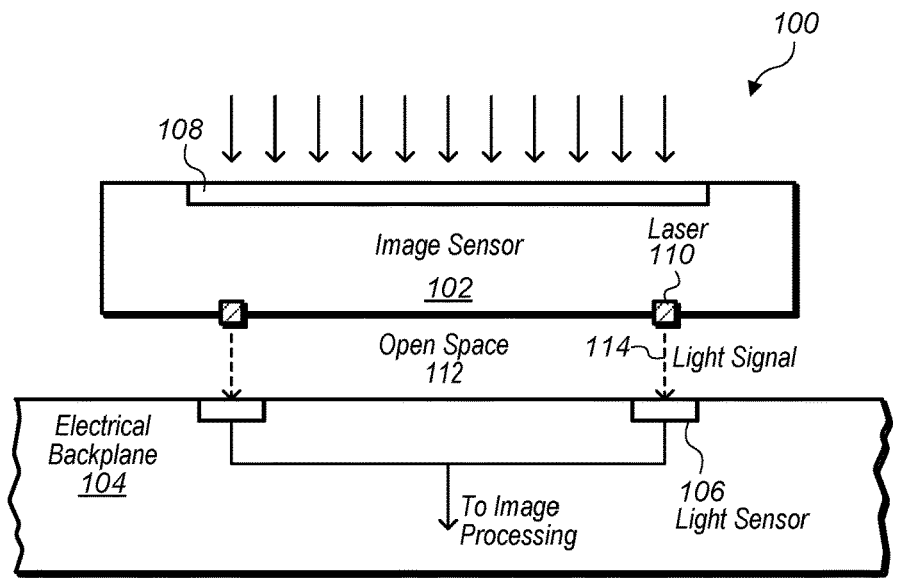
FIG. 1A illustrates light signals being sent across an open space between an image sensor and an electrical backplane, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

As mobile devices have evolved from large bulky devices to ever thinner devices, space within a mobile device for device components has become more limited. Also, as mobile devices have evolved, more sophisticated cameras have been included in the mobile devices that generate increasing amounts of image data. Accordingly, large amounts of image data generated by a camera included in a mobile device may need to be communicated to a processing component of the mobile device in a relatively small amount of space.

Some mobile devices may include camera image sensors mounted on, and/or in electrical communication with, an electrical backplane that includes a processing component that process the image data. The image sensor may communicate image data to the processing component via electrical traces or other electrical connections. However, electromagnetic fields induced by currents related to communicating the image data through the traces may interfere with the image data being communicated via other ones of the traces. In order to avoid such interference, a minimum amount of spacing between electrical traces may be required. However, as available space in a mobile device is reduced to achieve thinner devices, space available to support additional electrical traces or spacing of electrical traces may be limited. Also, a data transfer rate of electrical traces may be less than a data transfer rate of other data communication methods, such as photonic signal communication.

In some embodiments, in order to facilitate communication of large amounts of image data from an image sensor to a processing component of a mobile device in a small amount of space, an image sensor may include one or more light source modules integrated into the image sensor. The one or more light source modules may be configured to communicate image data from the image sensor via light signals to one or more light sensors in a location across an open space from the image sensor. For example, the light sensors may be integrated into an electrical backplane located across an open space from the image sensor. The electrical backplane may further include one or more processors configured to process image data received from the image sensor via photonic communication (e.g. via light signals). In some embodiments, light signals communicated between an image sensor and a light sensor may function in a similar manner as light signals communicated via fiber optic communications, however without using a fiber optic medium across the open space between the image sensor and the electrical backplane.

In addition, in some embodiments an image sensor may be situated in a camera such that a position of the image sensor is adjustable. For example, the image sensor may "float" (e.g. may be suspended) above an electrical backplane assembly and may be moveably supported by one or more adjustable actuators. In such embodiments, a position of the image sensor relative to an optical element of the camera, such as a lens (or group of lens), may be adjusted to focus the camera or to perform other adjustments. Also, in some embodiments, a position of an image sensor may be adjusted to stabilize a camera. For example, motion of the camera may be detected and a position of an image sensor may be adjusted to at least partially cancel out the motion of the camera in order to stabilize an image to be captured by the camera. In some embodiments, an image sensor may be situated in a camera such that the image sensor is in a fixed position relative to a backplane, lens (or lens system), or both.

In some embodiments, a light signal emitted from a light source of an image sensor may be used to determine a position and/or angle of the image sensor relative to another component, such as an electrical backplane assembly. For example, a light sensor may be configured to determine a position of an image sensor based on how light from a light source of the image sensor strikes the light sensor. In some embodiments, multiple light source modules may be included in an image sensor and multiple light sensors may be included in an electrical backplane assembly. A stabilization component may determine a relative position of the image sensor in up to six degrees of freedom (e.g. X, Y, Z, and Euler angles φ, θ, Ψ) based on light sensed by the light sensors and differences between light sensed by the light sensors. In some embodiments, a stabilization component may be implemented on a processor of a mobile device that performs other functions, such as processing image data, or may be implemented on a separate processor, application specific integrated circuit (ASIC), field programmable gate array (FPGA), etc. In some embodiments, an image sensor may include one or more light source modules that transmit image data and one or more additional light sources that emit light used for telemetry. In some embodiments, a light signal used to transmit image data may also be used for telemetry. In some embodiments, using a light signal for telemetry may allow for more flexible mounting locations than would be the case if magnetic sensors, such as Hall sensors were used for telemetry. Also, using light signals for telemetry may result in more accurate results without re-calibration (or with less recalibration than magnetic sensors). For example, using light signals for telemetry does not require a moving magnetic field (which requires a magnet to be mounted to move with an actuator, for example), as is the case for magnetic sensors, such as Hall sensors. Also, using a light signal for telemetry may reduce or eliminate drift experienced by magnetic sensors, such as Hall sensors. For example, light signals may not be significantly affected by temperature changes, such that temperature changes do not require recalibration, as is the case for Hall sensors.

In some embodiments, a fixed optical element, such as a lens (or group of lenses), may be included in a camera and an image sensor of the camera may be adjusted relative to the fixed optical element in order to focus or otherwise adjust the camera. In such embodiments, actuator components for adjusting a position of the optical element may be omitted thus reducing a thickness and/or weight of the camera.

In some embodiments, a moveable optical element, such as a lens (or group of lenses) may be included in a camera and an image sensor of the camera may be adjusted relative to the fixed optical element, the moveable optical element, may be adjusted relative to the image sensor, or both may be adjusted in order to focus or otherwise adjust the camera. In some embodiments, movement of an optical element and movement of an image sensor may be separately controlled.

In some embodiments, light source modules integrated into an image sensor and light sensors integrated into an electrical backplane assembly may be capable of high signal modulation rates. For example, in some embodiments a light source module and light sensor may be capable of communicating a gigabyte per second of data or more. Also, in some embodiments sets of light source modules and corresponding light sensors may communicate image data in parallel to increase a data transmission rate of image data between an image sensor of a mobile device camera and another component of the mobile device, such as an electrical backplane that includes a processor component. Such high data transmission rates may enable high-definition videos to be captured by an image sensor and communicated to a processing component.

Also, in some embodiments, a light source module at least partially integrated into an image sensor may not extend out from a surface of the image sensor by more than 100 microns. Said another way, a height of a light source module beyond an outer surface of an image sensor may be less than 100 microns. Thus an amount of height relative to a thickness of mobile device occupied by a light source module and/or light sensor may be small.

In some embodiments, a light source module and/or light sensor may be included in a structure that is raised relative to a surface of the image sensor such that light emitted from the light source module or light sensed at the light sensor do not propagate through a structure of the image sensor and affect an image capture portion of the image sensor. Also, in some embodiments, baffles may encircle or partially encircle a light source module and/or light sensor to prevent light from propagating through an interior portion of a camera or mobile device casing. For example, a tubular shaped baffle may encircle or partially encircle a light source module or a tubular shaped baffle may encircle or partially encircle a light sensor to prevent errant rays of light from propagating through a casing and possibly affecting images captured via an image capture portion of an image sensor.

FIG. 1A illustrates light signals being sent across an open space between an image sensor and an electrical backplane, according to some embodiments. Camera package 100 includes image sensor 102 and electrical backplane 104. In some embodiments, electrical backplane 104 may be an electrical backplane assembly that includes one or more processors, may be a processor that receives light signals itself, or may be another type of integrated circuit that is configured to process image data.

Electrical backplane 104 includes light sensors 106 integrated into electrical backplane 104. For example, in some embodiments electrical backplane 104 may include a silicon substrate and light sensors 106 may be embedded in the silicon substrate.

Image sensor 102 includes an image capture portion 108 that receives light waves from outside the camera related to an image that is to be captured and converts the light waves into image data. Image sensor 102 also includes light source modules, such as lasers 110, that are configured to emit light signals across an open space, such as open space 112 between image sensor 102 and electrical backplane 104. Light source modules, such as lasers 110, may be vertical cavity surface emitting lasers (VCSELs) or other types of light sources such as edge-emitting lasers. In some embodiments, light source modules, such as lasers 110, may be embedded in a silicon substrate of an image sensor. For example, light source modules, such as lasers 110, may be a VCSEL made of a Group III-Group V semiconductor material integrated into a silicon substrate of an image sensor, such as image sensor 102. For example, in some embodiments a light source module, such as lasers 110, may include Gallium Arsenide embedded in a silicon substrate of an image sensor, such as image sensor 102. In some embodiments a metal contact on a bottom side of a light source module may be included in a silicon substrate of an image sensor and a metal contact at a top side of the light source module may be connected via a conductor that extends out of the silicon substrate of the image sensor along sides of the light source module that extend out of the silicon substrate of the image sensor. In some embodiments a light source module, such as lasers 110, may include an Indium Phosphide Vertical Cavity Surface Emitting Lasers (VCSELs) operating at wavelengths in the range of 1550 nanometers.

Also, in some embodiments, drive components for driving a light source module may be integrated into a silicon substrate of an image sensor, such as image sensor 102.

In some embodiments, light signals received by light sensors of an electrical backplane assembly, such as light sensors 106 of electrical backplane 104, may be processed by a processing component to determine the image data. Additionally the image data may be further manipulated by the processing component or another processing component.

For example, light signals 114 received by light sensors 106 from lasers 110 may be processed by a processing component of electrical backplane 104 to determine image data captured by the image sensor 102 and to also further manipulate the image data. Note that FIG. 1 includes two lasers 110 and two light sensors 106. However in some embodiments more or less light source modules and light sensors may be used for photonic communication between an image sensor and a processing component.

In some embodiments, light source modules, such as lasers 110, may be integrated/embedded in a silicon substrate of an image sensor, such as image sensor 102, as opposed to being affixed to a surface of the image sensor. Integrating/embedding light source modules in a substrate of an image sensor may allow for more precise placement of the light source modules on the image sensor than can be achieved by affixing a self-contained light source module to an image sensor via an adhesive conductor. Also, integrating/embedding a light source module into a substrate of an image sensor may reduce a height of the light source module beyond a surface of the image sensor as compared to a self-contained light source module affixed to the image sensor.

In addition, image sensor 102 is "floating" (e.g., suspended) above electrical backplane 104 and may be supported by one or more adjustable actuators (not shown). A position of a floating image sensor may be adjusted in one or more directions to focus a camera, to stabilize a camera, and/or for other reasons. For example, image sensor 102 may be adjusted up and down relative to an optical element as discussed in more detail in FIG. 2. This is possible at least because image sensor 102 is separated from electrical backplane 104 by open space 112. Open space 112 may increase in height as image sensor 102 moves towards an optical element (not shown) and may decrease in height as image sensor 102 moves away from an optical element. Because, light signals emitted from lasers 110 pass through open space 112 and are not conveyed via a fixed physical medium, the light signals emitted from lasers 110 may be minimally affected by an image sensor changing positions, such as moving towards or away from an optical element.

Figure 1B:
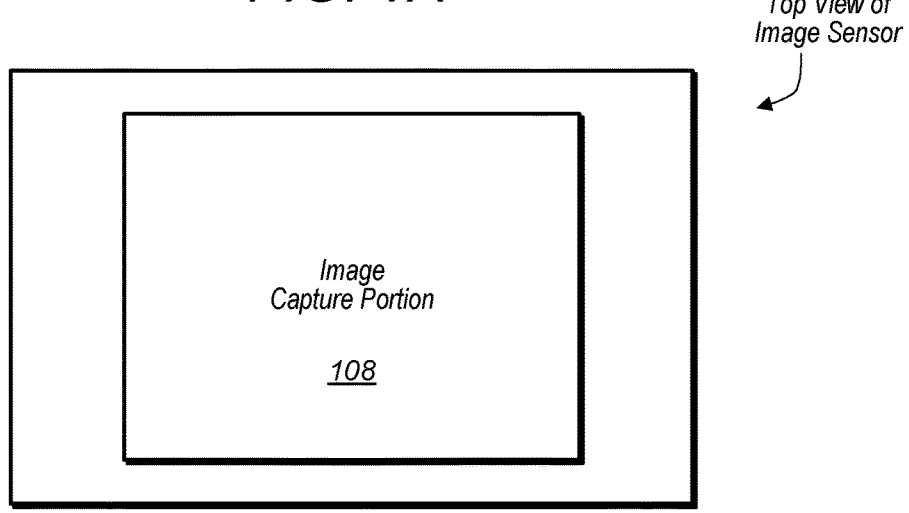
FIG. 1B illustrates a top view of an image sensor showing an image capture portion of the image sensor, according to some embodiments.

FIG. 1B illustrates a top view of an image sensor showing an image capture portion of the image sensor, according to some embodiments. Image capture portion 108 of image sensor 102 may be a pixelated image sensor or other suitable type of image sensor. In some embodiments, light source modules, such as lasers 110, are not included on a same side of an image sensor as an image capture portion, such as image capture portion 108. However, in other embodiments light source modules, such as lasers 110, may be included on a same side of an image sensor as an image capture portion (the portion of the image sensor that receives light during imaging from which one or more signals representing the received light is generated), but may be located on the image sensor in a location other than the image capture portion. For example, in some embodiments, one or more light source modules, such as lasers 110, may be located on the top side of image sensor 102 (the side of the image sensor positioned to receive incoming light during imaging) shown in FIG. 1B outside of the image capture portion 108.

Figure 1C:
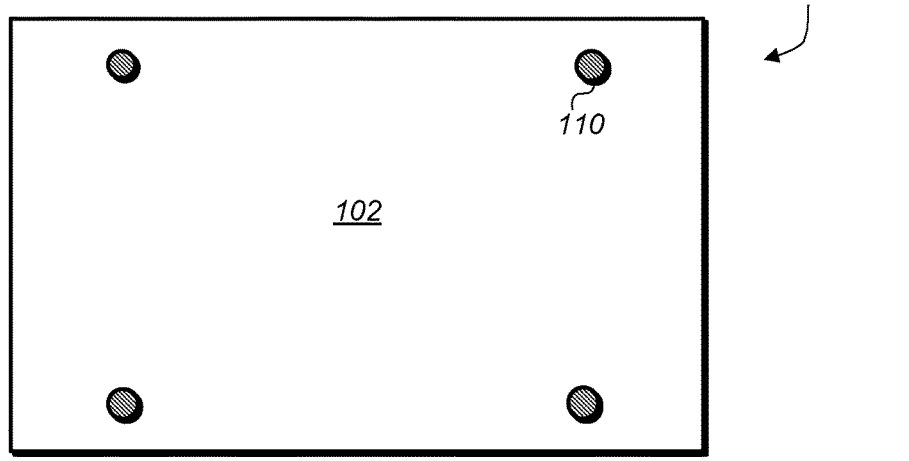
FIG. 1C illustrates a bottom view of an image sensor showing light source modules embedded in the image sensor, according to some embodiments.

FIG. 1C illustrates a bottom view of an image sensor showing light source modules embedded in the image sensor, according to some embodiments. As mentioned above, in some embodiments light source modules may be included only on sides of an image sensor that do not include the image capture portion, such as a bottom side of the image sensor. Image sensor 102 illustrated in FIG. 1C includes four light source modules, such as lasers 110, on a bottom side of the image sensor 102. In some embodiments, an image sensor may include any number of light source modules. Also, in some embodiments some light source modules included on an image sensor may transmit image data while other light source modules included on an image sensor may be used to determine telemetry data for the image sensor. In some embodiments a light source module may emit light signals that communicate image data and that are also used to determine telemetry of the image sensor.

Figure 2:
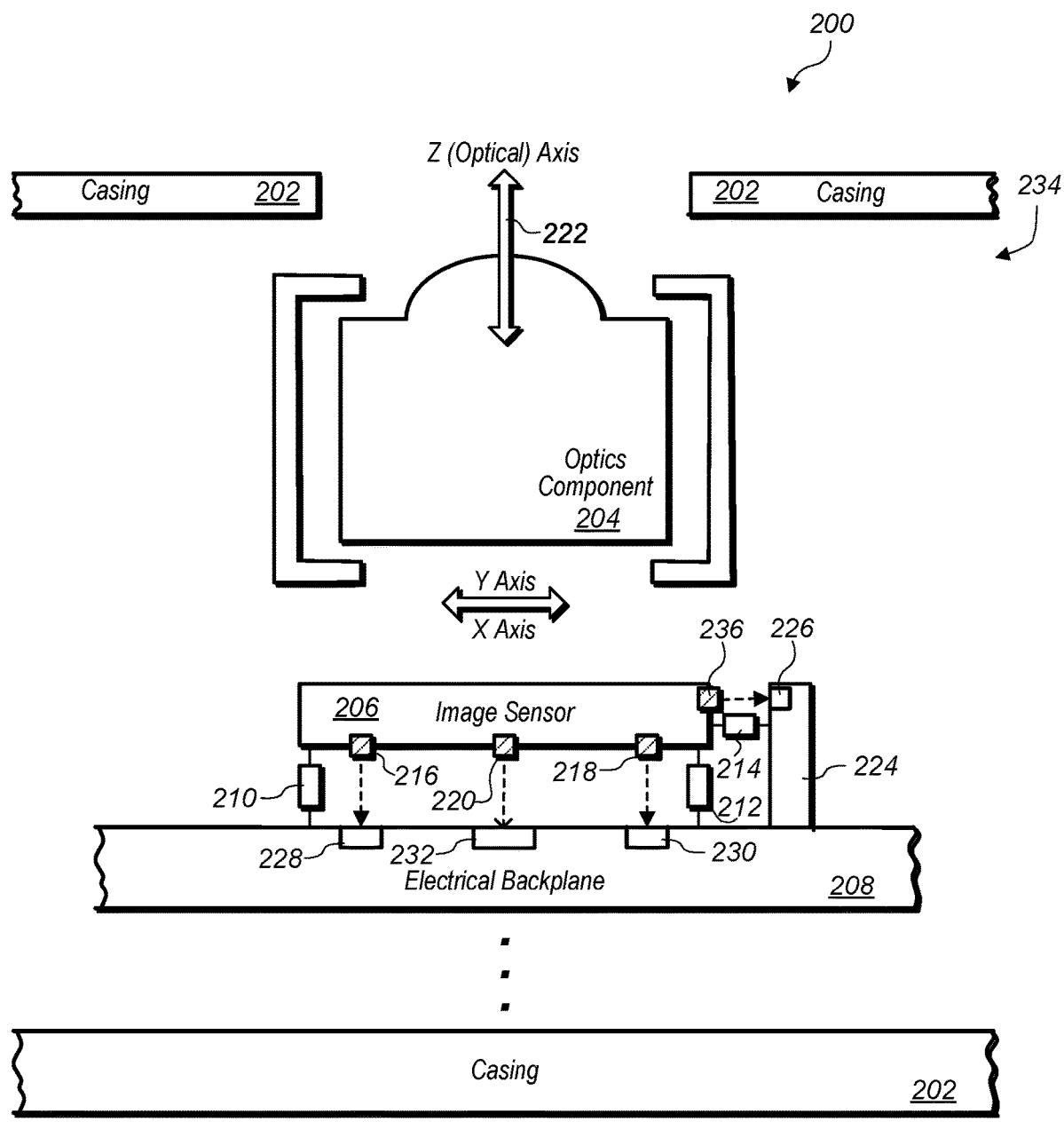
FIG. 2 illustrates a portion of a mobile device that includes an image sensor and an electrical backplane configured to communicate via light signals passed through an open space between the image sensor and the electrical backplane, according to some embodiments.

FIG. 2 illustrates a portion of a mobile device that includes an image sensor and electrical backplane configured to communicate via light signals passed through an open space between the image sensor and the electrical backplane, according to some embodiments. Mobile device 200 includes casing 202 and, positioned in an interior space 234 of casing 202, optical element 204, image sensor 206, and electrical backplane 208.

In some embodiments, an image sensor, such as image sensor 206, may float relative to an electrical backplane comprising a processor component, such as electrical backplane 208, and may be supported by one or more actuators. For example, image sensor 206 is supported by actuators 210, 212, and 214. In some embodiments an image sensor may be supported by additional actuators 210 and 212 at other ends of the image sensor. Also, in some embodiments additional actuators 214 may be coupled to other sides of the image sensor, for example a left side, a right side, a front side, or a back side. Also, in some embodiments actuators 210 and 212 may be coupled to a bottom side of an image sensor as shown in FIG. 2 or may be coupled to a top side of an image sensor.

In some embodiments, an actuator may include one or more flexures that suspend an image sensor and one or more voice coil motors positioned near one or more associated magnets. In some embodiments, an image sensor coupled to an actuator may be coupled to a portion of the actuator and the actuator may not be directly connected to the image sensor, but instead may be connected to one or more supporting components that are connected to or otherwise hold the image sensor. Moreover, as described herein, an "image sensor" may broadly refer to platform that includes an image sensor, which may be formed as a single substrate, or could be multiple substrates that are formed separately and connected. In the instance of an image sensor including multiple discrete components, the discrete components may be connected via appropriate electrical connections.

In some embodiments, an image sensor may include light source modules configured to transmit image data and one or more additional light source modules used to determine telemetry data for the image sensor. For example, image sensor 206 includes light source modules 216 and 218 used for telemetry and light source module 220 configured to transmit image data.

In some embodiments, a stabilization module included in or implemented via a processor component, which may be included in an electrical backplane, such as electrical backplane 208, may determine a relative position and/or angle of an image sensor, such as a relative position or angle of image sensor 206 relative to electrical backplane 208 or relative to optical element 204. The stabilization module may further determine one or more adjustments to be made to the positon or angle of the image sensor, for example image sensor 206, in order to stabilize the image sensor. Additionally or alternatively an image processing module included in or implemented on an electrical backplane including a processor component, such as electrical backplane 208, may focus an image to be captured via an image sensor, such as image sensor 206, by adjusting a position of the image sensor relative to an optical element, such as optical element 204, in the Z axis (optical axis) as shown by axis 222. The position may be adjusted by causing actuators, such as actuators 210 and 212, to move an image sensor, such as image sensor 206, up or down along the Z axis. Additionally, other actuators, such as actuators 214, may cause an image sensor, such as image sensor 206, to move in an X direction or a Y direction. Note that a single actuator 214 is shown in FIG. 2. However in some embodiments additional actuators 214 may be included on other sides of the image sensor 206. In some embodiments, respective ones of actuators 210, 212, and 214 may be adjusted different amounts relative to other ones of actuators 210, 212, and 214 to adjust an angular orientation of an image sensor. For example to cause the image sensor to rotate about the X, Y, or Z axis. In some embodiments, actuators as described above, may include both flexures that suspend the image sensor and a voice coil motor that causes the image sensor to move.

In some embodiments, a stabilization module, position module, and/or an image processing module may be implemented on the same processing components of an electrical backplane assembly, such as electrical backplane 208, different processing components of an electrical backplane assembly, such as different processing components of electrical backplane 208, or may be implemented on different circuit boards of a mobile device other than electrical backplane 208.

In some embodiments, a vertical structure, such as vertical structure 224, may extend out from, or be mounted on, a surface of backplane such as electrical backplane 208, to support an actuator, such as actuator 214. In some embodiments a vertical structure, such as vertical structure 224, may also include a light sensor, such as light sensor 226. In some embodiments image data, telemetry data, or light signals received via a light sensor included in a vertical structure, such as light sensor 226 included in vertical structure 224, may be transmitted to an electrical backplane comprising a processor component, such as electrical backplane 208, via a communication path integrated into the vertical structure. Also, control signals for an actuator, such as actuator 214, may be transmitted via a communication path integrated into a vertical structure, such as vertical structure 224.

In some embodiments, side communications between an image sensor and a backplane, such as image sensor 206 and backplane 208 may be performed without a vertical structure, such as vertical structure 224. For example, though not shown in FIG. 2, in some embodiments, light sensor 226 and light source module 236 may be oriented at an angle such that light emitted from light source module 236 mounted on a side of image sensor 206 is directed at a light sensor 226 that is mounted on electrical backplane 208 (instead of vertical structure 224 as shown in FIG. 2). Also, in some embodiments, a light sensor 226 may be mounted on another structure in a casing other than a vertical structure 224. The light sensor 226 may sense lateral light emitted from light source module 236 and transmit signals back to electrical backplane 208 via traces from the light sensor 226 to the electrical backplane 208.

In a similar manner, image data received via a light sensor, such as light sensor 232, may be transmitted to a processing component of an electrical backplane assembly, such as a processing component of electrical backplane 208, via a communication path integrated into the electrical backplane. Also, telemetry data from light sensors 228 and 230 may be communicated to a stabilization module or other processing component of an electrical backplane, such as electrical backplane 208, via communication paths integrated into the electrical backplane.

Figure 3A:
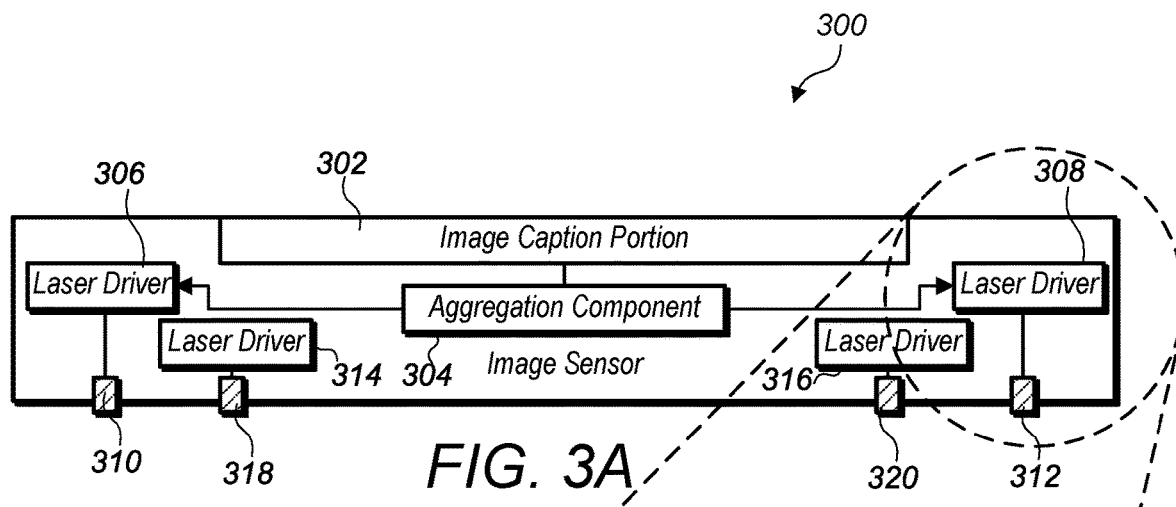
FIG. 3A illustrates an image sensor comprising light source modules, according to some embodiments.

FIG. 3A illustrates an image sensor comprising light source modules, according to some embodiments. Any of the cameras and/or mobile devices described herein may include an image sensor such as image sensor 300 illustrated in FIG. 3A. Image sensor 300 includes image capture portion 302, aggregation component 304, and laser drivers 306 and 308 that drive light source modules 310 and 312. Additionally, image sensor 300 includes laser drivers 314 and 316 that drive light source modules 318 and 320. In some embodiments, some light source modules included in image sensor may be used to determine telemetry data for the image sensor while other light source modules included in the image sensor may be used to transmit image data. For example, light source modules 310 and 312 may be used to transmit data while light source modules 318 and 320 may be used to determine telemetry data. In some embodiments the same light source module may be used to transmit image data and to determine telemetry data.

In some embodiments, an aggregation component may aggregate image data received from pixelated image sensors included in an image capture portion of an image sensor. For example, aggregation component 304 may aggregate image data received from pixelated image sensors of image capture portion 302. In some embodiments, an aggregation component, such as aggregation component 304, may further distribute aggregated image data across more than one photonic communication link to communicate the image data to a processing component. For example, aggregation component 304 may distribute image data to laser driver 306 to be communicated via light source module 310 and communicate image data to laser driver 308 to be communicated via light source module 312. In some embodiments, image data for a given image may be sent in parallel to a processing component via multiple photonic communication links.

Figure 3B:
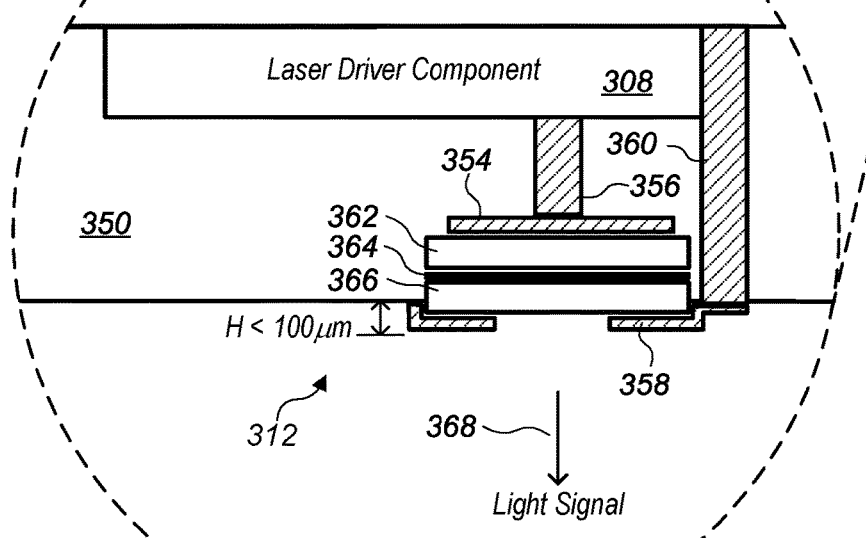
FIG. 3B illustrates a light source module at least partially embedded in a silicon substrate of an image sensor, according to some embodiments.

FIG. 3B illustrates a light source module at least partially embedded in a silicon substrate of an image sensor, according to some embodiments. Silicon substrate 350 includes laser driver component 308 embedded in the silicon substrate 350 and light source module 312 at least partially embedded in the silicon substrate 350. Light source module 312 includes a bottom metal contact 354 electrically coupled to laser driver component 308 by via 356 embedded in silicon substrate 350. Also, light source module 312 includes top metal contact 358 electrically coupled to laser driver component 308 by via 360 embedded in silicon substrate 350. Additionally light source module 312 includes lower reflector 362, upper reflector 366, and quantum well 364 positioned between lower reflector 362 and upper reflector 366. In some embodiments, top metal contact 358 may be a conductor that comes up out of the silicon substrate 350 along the sides of upper reflector 366 and goes over the top of upper reflector 366. Bottom metal contact 354 and top metal contact 358 may create a voltage differential across light source module 312 that causes quantum well 364 to emit photons. The photons may be intensified and directed via lower reflector 362 and upper reflector 366 and may be emitted perpendicular to a surface of image sensor 300 as light signals 368.

Figure 4A:
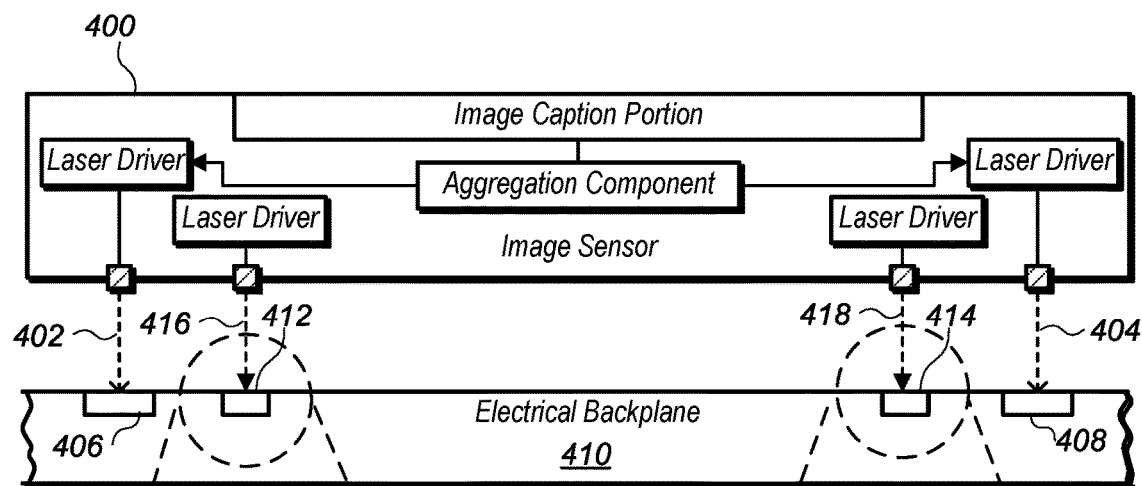
FIG. 4A illustrates an image sensor with light source modules and an electrical backplane comprising light sensors, according to some embodiments.

FIG. 4A illustrates an image sensor with light source modules and an electrical backplane comprising light sensors, according to some embodiments. Image sensor 400 may be a similar image sensor as image sensor 300 illustrated in FIG. 3. In FIG. 4 light signals 402 and 404 are received by light sensors 406 and 408 of electrical backplane 410. In some embodiments, electrical backplane 410 may be an electrical backplane assembly that includes one or more processors and light sensors embedded in the electrical backplane assembly. Also, in some embodiments, light sensors, such as light sensors 406 and 408, may be incorporated into a packaging of a processor. For example, the light sensors may be located directly on the processor package as opposed to being included in an electrical backplane assembly that includes a processor package coupled to the electrical backplane assembly. In addition, in some embodiments, an electrical backplane assembly that includes a processor component, a processor package, or other processor arrangement, may include additional light sensors. The additional light sensors may be configured to determine a position or angle of an image sensor emitting light signals based on where and how the light signals from the image sensor strike the light sensors. For example electrical backplane 410 includes light sensors 412 and 414 that may be used to determine a relative position or angle of image sensor 400 based on how light signals 416 and 418 emitted from image sensor 400 strike light sensors 412 and 414.

Figures 4B, 4C:
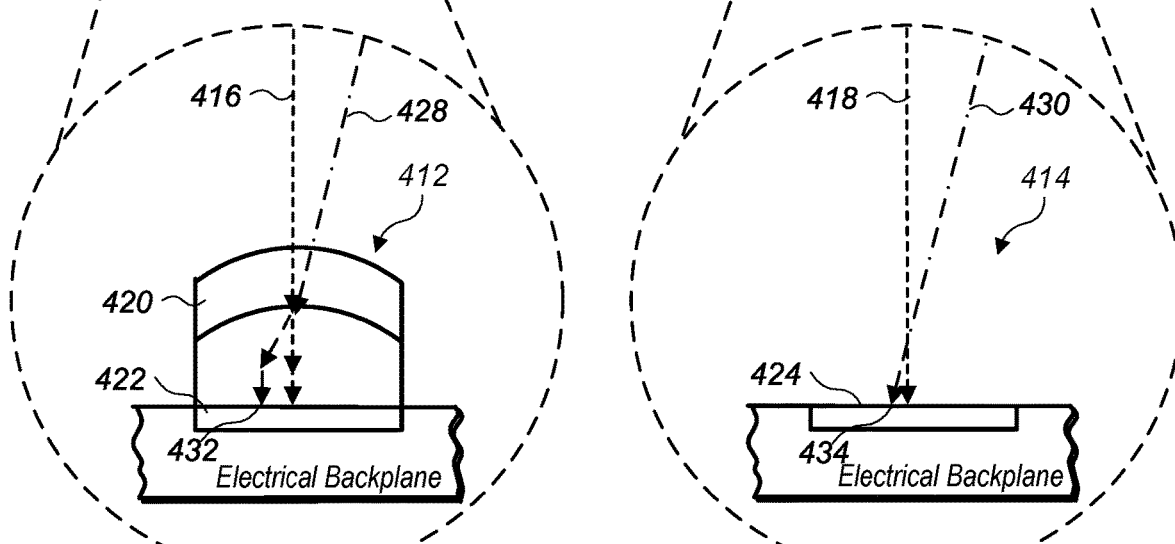
FIGS. 4B and 4C illustrate types of light sensors that may be used according to some embodiments.

FIGS. 4B and 4C illustrate types of light sensors that may be used for light sensors 412 and 414, according to some embodiments. Light sensor 412 includes a lens 420 and a light sensing portion 422. Light sensor 414 does not include a lens, such as lens 420, but does include a light sensing portion 424. In some embodiments, a light sensing portion of a light sensor may include a grid of light sensing elements (e.g. an array of light-sensing pixels), such as light sensing portion 426 shown from a top view in FIG. 4D. Light sensing portion 426 shown in FIG. 4D may be the same as light sensing portion 422 or 424 shown in FIGS. 4B and 4C. In some embodiments, a light sensor, such as light sensors 412 and 414 may include a position sensitive detector (PSD). For example, light sensing portions 422, 424, and 426 may all be PSDs. Also, in some embodiments light sensors, such as light sensors 412 and 414, may include silicon quad detectors (SQDs). In some embodiments other types of light sensing portions may be used in a light sensor or other types of light sensors may be used.

Figure 4D:
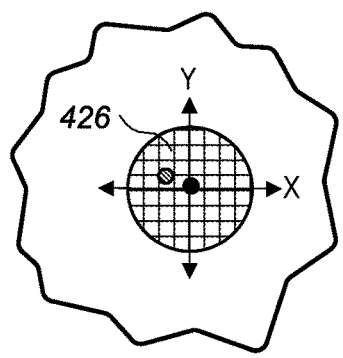
FIG. 4D illustrates a cut away of an electrical backplane showing a top view of a light sensor, according to some embodiments.

In some embodiments, a light sensor with a lens may be used to determine an angular position of an image sensor based on an angle at which a light signal from the image sensor strikes the lens of the light sensor. For example, as can be seen in FIG. 4D light striking lens 420 at an angle may be refracted by lens 420. In some embodiments light refracted by a lens may strike a light sensing portion of a light sensor, such as light sensing portion 422, in a different location on the light sensing portion that the light would have struck the light sensing portion if the light had not been refracted by the lens. Also, light passing through a lens may be refracted different amounts based on an angle at which the light strikes the lens.

For example, light signal 428 strikes lens 420 at a greater angle than light signal 416. Also, light signal 430 strikes light sensing portion 424 of light sensor 414 at a similar angle. However, light signal 428 is refracted by lens 420 such that light signal 428, after passing through lens 420, strikes light sensing portion 422 of light sensor 412 at location 432 that is further from a center of light sensing portion 422 than the location at which light signal 430 strikes light sensing portion 424 of light sensor 414.

In some embodiments, a stabilization module or position module may compare telemetry data from multiple light sensors, such as light sensors 412 and 414 to determine a relative positon and/or angle of an image sensor. For example, a stabilization module or position module may compare differences in where light signal 416 and 418 strike respective light sensing portions 422 and 424. Based on the differences and a known characteristic of lens 420, the stabilization module or position module may differentiate between translation of image sensor 400 and angular movement of image sensor 400. For example, if image sensor is translated while remaining parallel to electrical backplane 410 then there should be little or no difference in respective distances from center at which respective light signals 416 and 418 strike light sensing portions 422 and 424 of light sensors 412 and 414. However, if image sensor 400 is rotated, i.e. moved in an angular direction such that the image sensor is no longer parallel to the processor, light signal 416 passing through lens 420 will be refracted a particular amount proportional to the amount of rotation of the image sensor. Thus, a distance from center at which light signal 416 strikes light sensing portion 422 of light sensor 412 will be greater than a distance from center at which light signal 418 strikes light sensing portion 424 of light sensor 414. Based on this difference, a stabilization module or position module may determine an angular amount that image sensor 400 has been rotated.

In some embodiments, multiple sets of light sensors with and without lenses may be included in a camera or mobile device to determine relative positions and angles of an image sensor in X, Y, and Z directions and angular movement related to pitch, roll, and yaw. Furthermore, as explained above in regard to FIG. 2. In some embodiments, a camera or mobile device may further include actuators configured to adjust a position or angle of an image sensor based on relative positions and/or angle determined as described above. In some embodiments, other suitable types of light sensors with or without lens may be used.

Figure 5A:
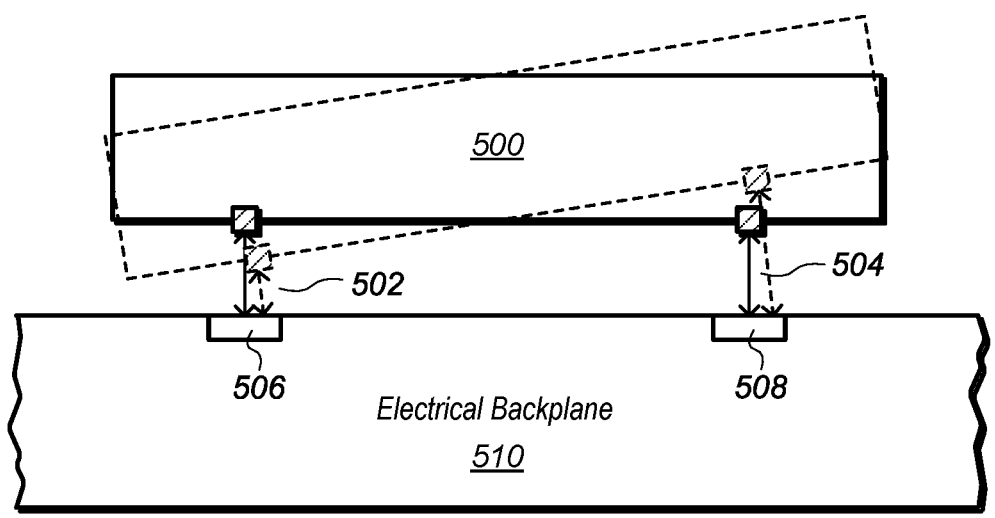
FIGS. 5A-5B illustrate light source modules and light sensors being used to measure a relative position or angle of an image sensor, according to some embodiments.
Figure 5B:
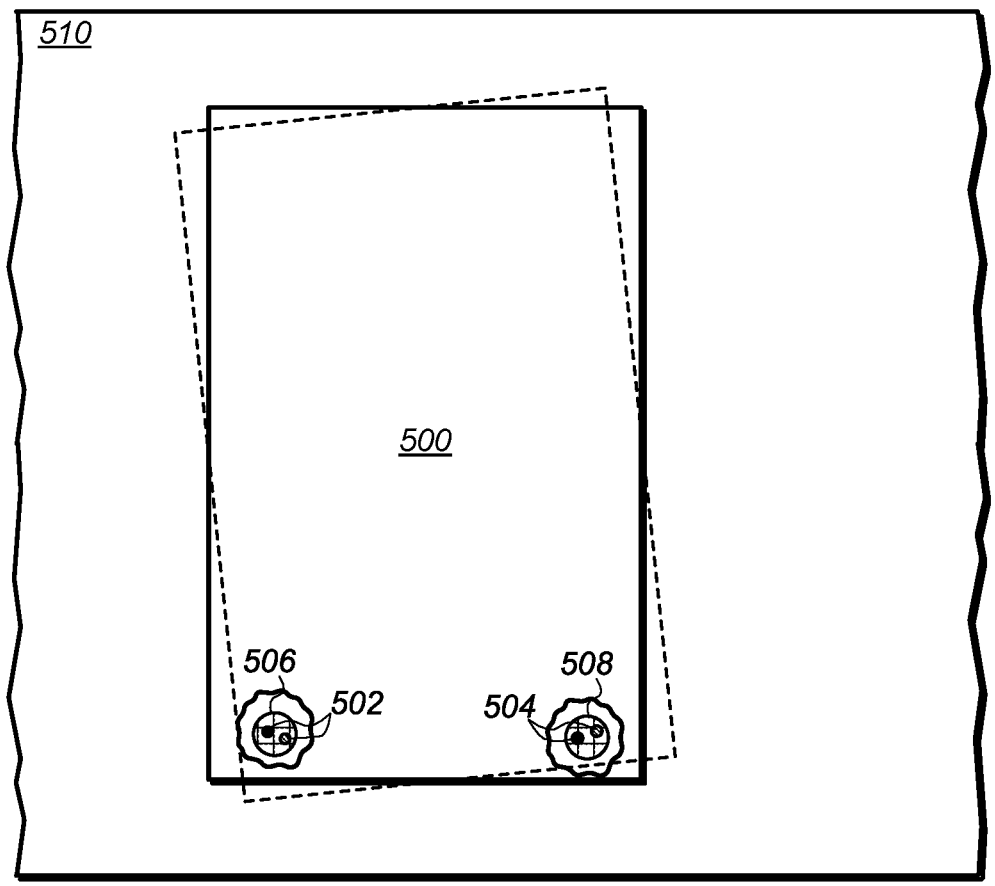

For example, FIGS. 5A-5B illustrate light source modules and light sensors being used to measure a relative position or angle of an image sensor, according to some embodiments. In FIG. 5A image sensor 500 rolls to the left. Light signals 502 and 504 strike light sensors 506 and 508 of electrical backplane 510 at different locations on the light sensor as the image sensor rolls. In some embodiments, one of the light sensors, such as light sensor 506, may include a lens such as light sensor 412 in FIG. 4B. Based on differences in location on the respective light sensors at which the respective light signals strike the light sensing portions of the light sensors as described above in regard to FIG. 4 a stabilization module or position module may determine an angle of roll of image sensor 500.

In another example, FIG. 5B shows image sensor 500 rotating about the Z axis. In a similar manner as described above light sensors 506 and 508 may determine an amount of angular rotation about the Z axis by image sensor 500 by comparing locations on light sensors 506 and 508 at which light signals 502 and 504 strike light sensing portions of light sensors 506 and 508. In some embodiments, a stabilization module may determine both translation in the X and Y direction and rotation about the X, Y, or Z axis. In some embodiments, a camera focus module may position the image sensor in the Z direction to focus an image. In such embodiments, a light sensor configured to determine a position of an image sensor in the Z direction may be omitted. However, in other embodiments, a camera that uses a camera focus module to adjust a Z position of an image sensor may further include a light sensor configured to determine a position of the image sensor in the Z direction.

Figure 6:
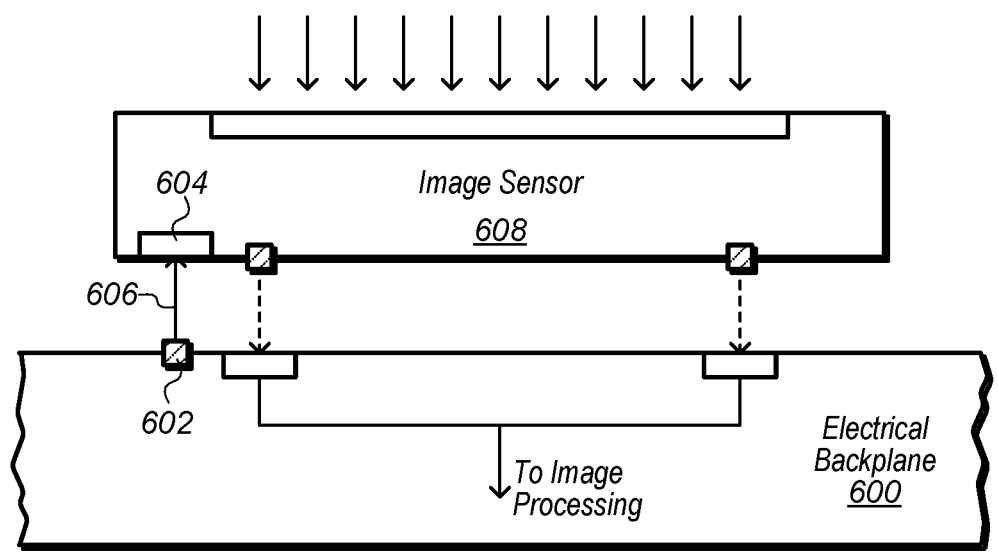
FIG. 6 illustrates an image sensor at least partially powered by light emitted from a light source module of an electrical backplane, according to some embodiments.

FIG. 6 illustrates an image sensor at least partially powered by light emitted from a light source module of an electrical backplane, according to some embodiments.

In some embodiments, an electrical backplane assembly, such as electrical backplane 600 may further include a light source module, such as a VCSEL or other type of light source that emits light directed towards an image sensor. In some embodiments, an image sensor may include a photo cell that is configured to convert light energy into electrical energy used to at least partially power the image sensor. For example, electrical backplane 600 includes light source module 602 that directs light 606 at photo cell 604 of image sensor 608. In some embodiments, light 606 may be converted into electrical energy by photo cell 604. The electrical energy may be used to at least partially power image sensor 608.

Additionally, light source modules included in an image sensor or in an electrical backplane, such as electrical backplane 600, may be "eye safe" lasers. For example, the light source modules may be configured to emit light that is not harmful to the human eye even if no eye protection is worn by a person handling the laser.

Figure 7:
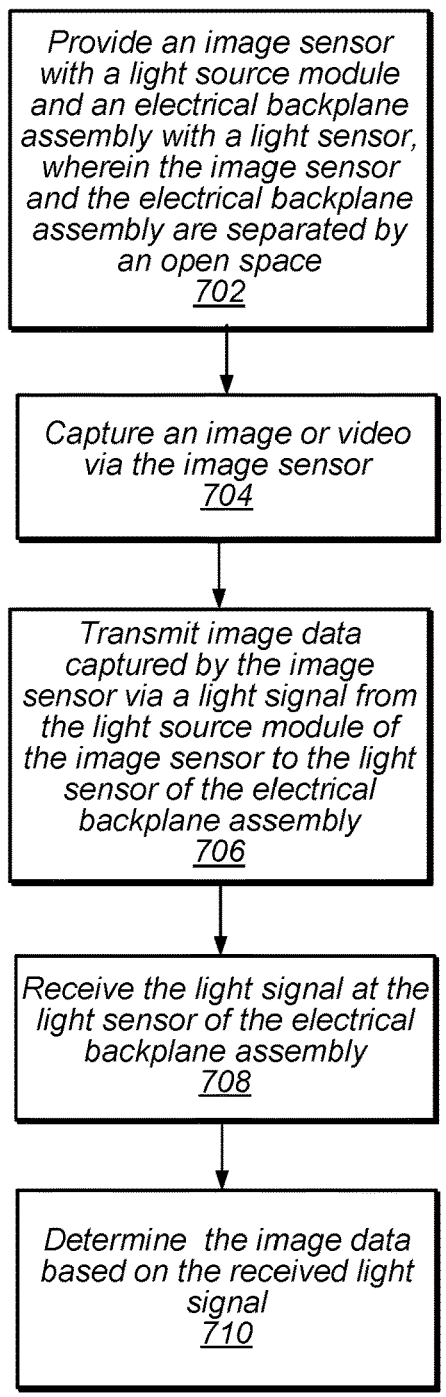
FIG. 7 is a flowchart of a method for transmitting image data between an image sensor and an electrical backplane using light signals, according to some embodiments.

FIG. 7 is a flowchart of a method for transmitting image data between an image sensor and a processor using light signals, according to some embodiments. At 702 an image sensor with a light source module and an electrical backplane assembly with a light sensor are provided. The image sensor and the electrical backplane assembly are separated by an open space. For example, the image sensor and electrical backplane assembly may be included in a camera package or may be components included in a mobile device, or may be included in a camera package that is turn included in a mobile device.

At 704 an image is captured by the image sensor or a video is captured by the image sensor. Capturing an image or video by an image sensor may cause image data for the image or video to be generated. In some embodiments, the image or video data may be serialized into multiple data streams each comprising a portion of the captured image data or video data. At 706 the image data is transmitted to a processing component such as a processor included in the electrical backplane assembly. To transmit the image data, the image data may be communicated via light signals emitted from light source modules included in the image sensor. The light signals may be directed at corresponding light sensors of the electrical backplane assembly that are on another side of the open space from the image sensor.

At 708, the light signals may be received by the processing component. For example, the light signals may be received at light sensors included in an electrical backplane assembly that also includes one or more processors configured to process the image data. At 710, image data is determined based on the received light signals. In some embodiments, a processor may interpret signals received from the light sensors that correspond to the light signals to determine the image data. In some embodiments, the image data may further be processed for storage or display.

Figure 8:
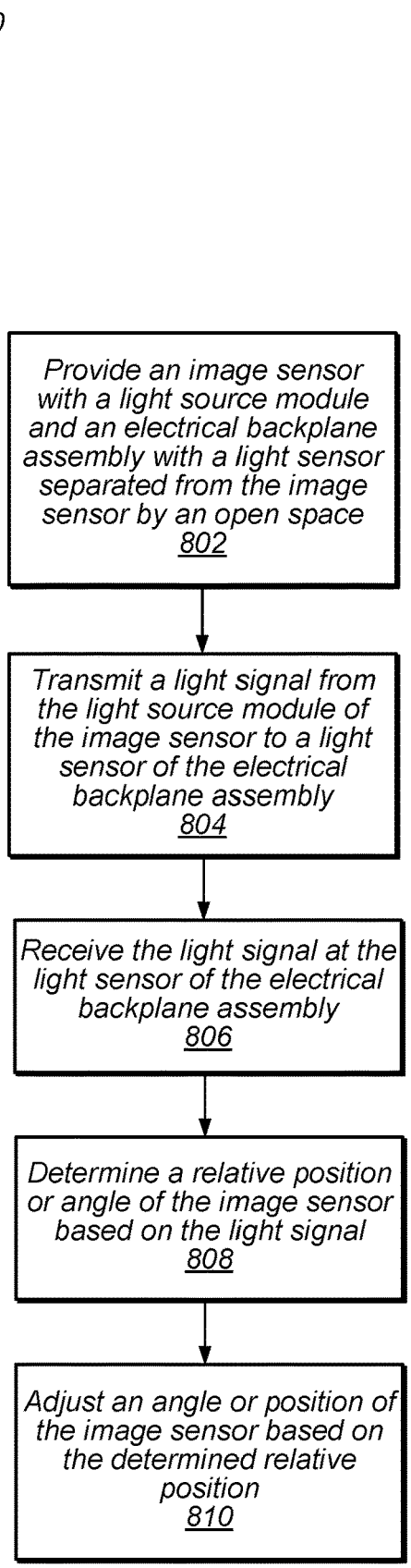
FIG. 8 is a flowchart of a method for determining and/or adjusting a position or angle of an image sensor using light signals, according to some embodiments.

FIG. 8 is a flowchart of a method for determining and/or adjusting a position or angle of an image sensor using light signals, according to some embodiments. In a similar manner as 702, at 802 an image sensor with a light source module and an electrical backplane assembly with a light sensor are provided.

At 804 a light signal is transmitted from the light source module of the image sensor to a light sensor of the electrical backplane assembly. In some embodiments, separate light source modules and light sensors may be used to transmit image data and to determine a position and/or an angle of an image sensor. In other embodiments a particular light source module in light sensor may be used to transmit image data and determine a position and/or angle of an image sensor.

At 806, light transmitted from the light source module of the image sensor is received by the light sensor of the electrical backplane assembly. Based on where the light from the light source module strikes the light sensor, a position and/or angle of the image sensor may be determined in a similar manner as described above in regard to FIG. 4. In some embodiments, a position or an angle of an image sensor may be determined based on comparing telemetry information from multiple light sensors.

At 808 a relative position or angle of the image sensor is determined. For example, a stabilization module may compare telemetry information from one or more light sensors to determine a relative position or angle of the image sensor.

At 810 one or more adjustments to the position and/or angle of the image sensor are performed based on the determined relative position and/or angle of the image sensor. For example, a stabilization module may be programmed to maintain an image sensor in a particular position or angle and may generate control signals to cause one or more actuators to adjust a relative position or angle of an image sensor. In some embodiments, a stabilization module may adjust a position or angle of an image sensor to cancel out unwanted motions of the image sensor, such as motion caused by an operator of a mobile device not holding the mobile device steady while capturing an image.

Multifunction Device Examples

Embodiments of electronic devices, user interfaces for such devices, and associated processes for using such devices are described. In some embodiments, the device is a portable communications device, such as a mobile telephone, that also contains other functions, such as PDA and/or music player functions. Other portable electronic devices, such as laptops, cameras, cell phones, or tablet computers, may also be used. It should also be understood that, in some embodiments, the device is not a portable communications device, but is a desktop computer with a camera. In some embodiments, the device is a gaming computer with orientation sensors (e.g., orientation sensors in a gaming controller). In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Figure 9:
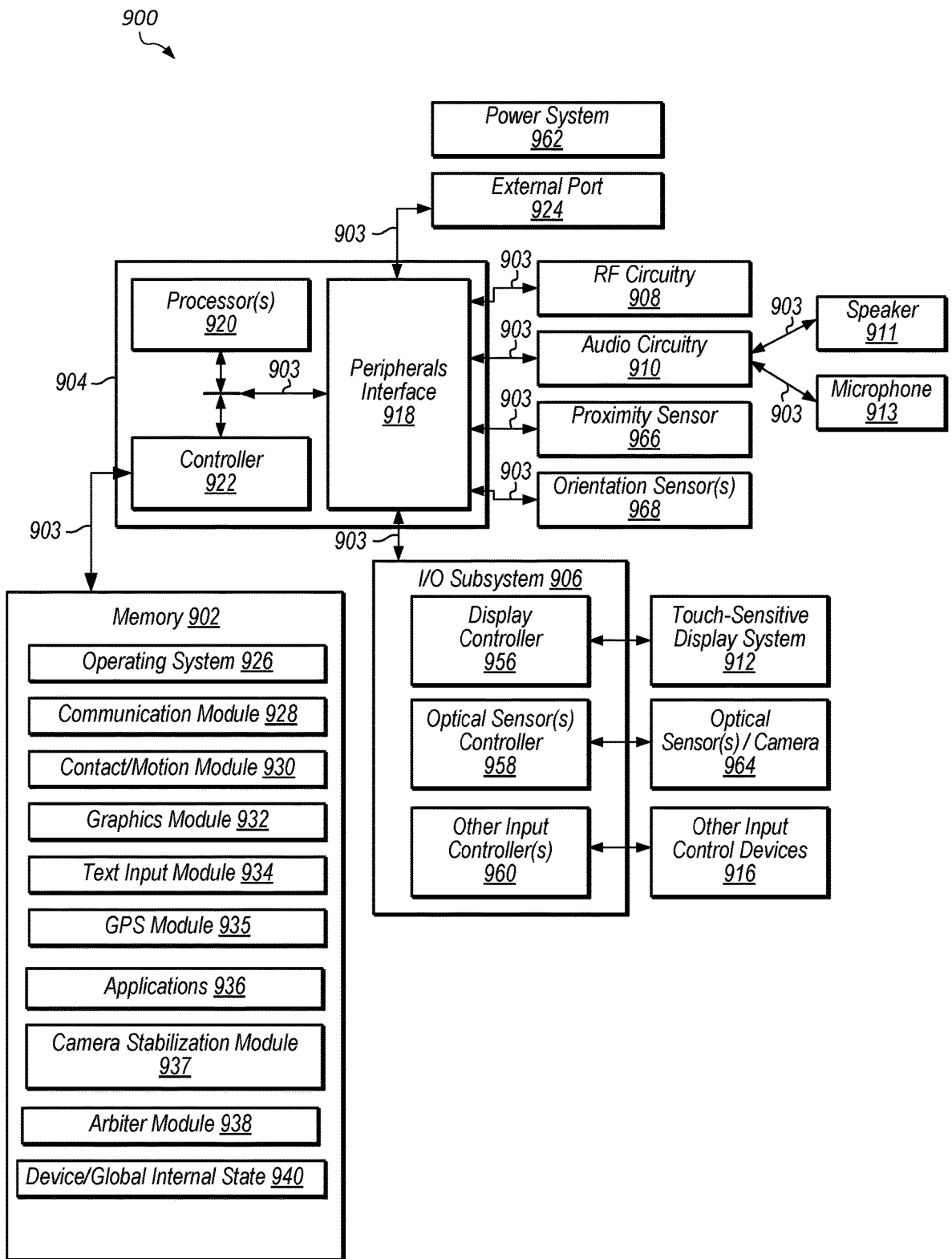
FIG. 9 illustrates a block diagram of a portable multifunction device with a camera in accordance with some embodiments.

Attention is now directed toward embodiments of portable devices with cameras. FIG. 9 illustrates a block diagram of an example portable multifunction device that may include a camera module (e.g., the cameras described above with reference to FIG. 1-8), in accordance with some embodiments. Camera 964 is sometimes called an "optical sensor" for convenience, and may also be known as or called an optical sensor system. Device 900 may include memory 902 (which may include one or more computer readable storage mediums), memory controller 922, one or more processing units (CPUs) 920, peripherals interface 918, RF circuitry 908, audio circuitry 910, speaker 911, touch-sensitive display system 912, microphone 913, input/output (I/O) subsystem 906, other input or control devices 916, and external port 924. Device 900 may include one or more optical sensors 964. These components may communicate over one or more communication buses or signal lines 903.

It should be appreciated that device 900 is only one example of a portable multifunction device, and that device 900 may have more or fewer components than shown, may combine two or more components, or may have a different configuration or arrangement of the components. The various components shown in FIG. 9 may be implemented in hardware, software, or a combination of hardware and software, including one or more signal processing and/or application specific integrated circuits.

Memory 902 may include high-speed random access memory and may also include non-volatile memory, such as one or more magnetic disk storage devices, flash memory devices, or other non-volatile solid-state memory devices. Access to memory 902 by other components of device 900, such as CPU 920 and the peripherals interface 918, may be controlled by memory controller 922.

Peripherals interface 918 can be used to couple input and output peripherals of the device to CPU 920 and memory 902. The one or more processors 920 run or execute various software programs and/or sets of instructions stored in memory 902 to perform various functions for device 900 and to process data.

In some embodiments, peripherals interface 918, CPU 920, and memory controller 922 may be implemented on a single chip, such as chip 904. In some other embodiments, they may be implemented on separate chips. In some embodiments, light sensors as described herein may be implemented on the same chip as peripherals interface 918, CPU 920, and memory controller 922 or may be implemented on a separate chip.

RF (radio frequency) circuitry 908 receives and sends RF signals, also called electromagnetic signals. RF circuitry 908 converts electrical signals to/from electromagnetic signals and communicates with communications networks and other communications devices via the electromagnetic signals. RF circuitry 908 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 908 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 910, speaker 911, and microphone 913 provide an audio interface between a user and device 900. Audio circuitry 910 receives audio data from peripherals interface 918, converts the audio data to an electrical signal, and transmits the electrical signal to speaker 911. Speaker 911 converts the electrical signal to human-audible sound waves. Audio circuitry 910 also receives electrical signals converted by microphone 913 from sound waves. Audio circuitry 910 converts the electrical signal to audio data and transmits the audio data to peripherals interface 918 for processing. Audio data may be retrieved from and/or transmitted to memory 902 and/or RF circuitry 908 by peripherals interface 918. In some embodiments, audio circuitry 910 also includes a headset jack (e.g., 1012, FIG. 10). The headset jack provides an interface between audio circuitry 910 and removable audio input/output peripherals, such as output-only headphones or a headset with both output (e.g., a headphone for one or both ears) and input (e.g., a microphone).

I/O subsystem 906 couples input/output peripherals on device 900, such as touch screen 912 and other input control devices 916, to peripherals interface 918. I/O subsystem 906 may include display controller 956 and one or more input controllers 960 for other input or control devices. The one or more input controllers 960 receive/send electrical signals from/to other input or control devices 916. The other input control devices 916 may include physical buttons (e.g., push buttons, rocker buttons, etc.), dials, slider switches, joysticks, click wheels, and so forth. In some alternate embodiments, input controller(s) 960 may be coupled to any (or none) of the following: a keyboard, infrared port, USB port, and a pointer device such as a mouse. The one or more buttons (e.g., 1008, FIG. 10) may include an up/down button for volume control of speaker 911 and/or microphone 913. The one or more buttons may include a push button (e.g., 1006, FIG. 10).

Touch-sensitive display 912 provides an input interface and an output interface between the device and a user. Display controller 956 receives and/or sends electrical signals from/to touch screen 912. Touch screen 912 displays visual output to the user. The visual output may include graphics, text, icons, video, and any combination thereof (collectively termed "graphics"). In some embodiments, some or all of the visual output may correspond to user-interface objects.

Touch screen 912 has a touch-sensitive surface, sensor or set of sensors that accepts input from the user based on haptic and/or tactile contact. Touch screen 912 and display controller 956 (along with any associated modules and/or sets of instructions in memory 902) detect contact (and any movement or breaking of the contact) on touch screen 912 and converts the detected contact into interaction with user-interface objects (e.g., one or more soft keys, icons, web pages or images) that are displayed on touch screen 912. In an example embodiment, a point of contact between touch screen 912 and the user corresponds to a finger of the user.

Touch screen 912 may use LCD (liquid crystal display) technology, LPD (light emitting polymer display) technology, or LED (light emitting diode) technology, although other display technologies may be used in other embodiments. Touch screen 912 and display controller 956 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 912. In an example embodiment, projected mutual capacitance sensing technology is used.

Touch screen 912 may have a video resolution in excess of 800 dpi. In some embodiments, the touch screen has a video resolution of approximately 860 dpi. The user may make contact with touch screen 912 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 900 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 912 or an extension of the touch-sensitive surface formed by the touch screen.

Device 900 also includes power system 962 for powering the various components. Power system 962 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 900 may also include one or more optical sensors or cameras 964. FIG. 9 shows an optical sensor 964 coupled to optical sensor controller 958 in I/O subsystem 906. Optical sensor 964 may include charge-coupled device (CCD) or complementary metal-oxide semiconductor (CMOS) phototransistors. Optical sensor 964 receives light from the environment, projected through one or more lens, and converts the light to data representing an image. Optical sensor 964 may be an image sensor as described herein in FIGS. 1-8. In conjunction with imaging module 943 (also called a camera module), optical sensor 964 may capture still images or video. In some embodiments, an imaging module, such as imaging module 943 may be included in an electrical backplane assembly or implemented on a processor as described herein in FIGS. 1-8. In some embodiments, an optical sensor 964 is located on the back of device 900, opposite touch screen display 912 on the front of the device, so that the touch screen display 912 may be used as a viewfinder for still and/or video image acquisition. In some embodiments, another optical sensor is located on the front of the device so that the user's image may be obtained for videoconferencing while the user views the other video conference participants on the touch screen display.

Device 1400 may also include one or more proximity sensors 966. FIG. 9 shows proximity sensor 966 coupled to peripherals interface 918. Alternately, proximity sensor 966 may be coupled to input controller 960 in I/O subsystem 906. In some embodiments, the proximity sensor 966 turns off and disables touch screen 912 when the multifunction device 900 is placed near the user's ear (e.g., when the user is making a phone call).

Device 900 includes one or more orientation sensors 968. In some embodiments, the one or more orientation sensors 968 include one or more accelerometers (e.g., one or more linear accelerometers and/or one or more rotational accelerometers). In some embodiments, the one or more orientation sensors 968 include one or more gyroscopes. In some embodiments, the one or more orientation sensors 968 include one or more magnetometers. In some embodiments, the one or more orientation sensors 968 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 1400. In some embodiments, the one or more orientation sensors 968 include any combination of orientation/rotation sensors. FIG. 9 shows the one or more orientation sensors 968 coupled to peripherals interface 918. Alternately, the one or more orientation sensors 968 may be coupled to an input controller 960 in I/O subsystem 906. In some embodiments, information is displayed on the touch screen display 912 in a portrait view or a landscape view based on an analysis of data received from the one or more orientation sensors 968.

In some embodiments, the software components stored in memory 902 include operating system 926, communication module (or set of instructions) 928, contact/motion module (or set of instructions) 930, graphics module (or set of instructions) 932, text input module (or set of instructions) 934, Global Positioning System (GPS) module (or set of instructions) 935, camera stabilization module 937, arbiter module 938 and applications (or sets of instructions) 936. Furthermore, in some embodiments memory 902 stores device/global internal state 940. Device/global internal state 940 includes one or more of: active application state, indicating which applications, if any, are currently active; display state, indicating what applications, views or other information occupy various regions of touch screen display 912; sensor state, including information obtained from the device's various sensors and input control devices 916; and location information concerning the device's location and/or attitude.

Operating system 926 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 928 facilitates communication with other devices over one or more external ports 924 and also includes various software components for handling data received by RF circuitry 908 and/or external port 924. External port 924 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 930 may detect contact with touch screen 912 (in conjunction with display controller 956) and other touch sensitive devices (e.g., a touchpad or physical click wheel). Contact/motion module 930 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 930 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 930 and display controller 956 detect contact on a touchpad.

Contact/motion module 930 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 932 includes various known software components for rendering and displaying graphics on touch screen 912 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 932 stores data representing graphics to be used. Each graphic may be assigned a corresponding code. Graphics module 932 receives, from applications etc., one or more codes specifying graphics to be displayed along with, if necessary, coordinate data and other graphic property data, and then generates screen image data to output to display controller 956.

Text input module 934, which may be a component of graphics module 932, provides soft keyboards for entering text in various applications.

GPS module 935 determines the location of the device and provides this information for use in various applications.

Camera stabilization module 737 determines adjustments to be made to actuators to adjust a position of an image sensor as described herein in FIGS. 1-8. In some embodiments a camera stabilization module may be or include a position module that positions an image sensor a particular distance from an optical element to focus an image being captured by the image sensor.

Applications 936 may include the following modules (or sets of instructions), or a subset or superset thereof:
- contacts module (sometimes called an address book or contact list);
- telephone module;
- video conferencing module;
- e-mail client module;
- instant messaging (IM) module;
- workout support module;
- camera module for still and/or video images;
- image management module;
- browser module;
- calendar module;
- widget modules, which may include one or more of: weather widget, stocks widget, calculator widget, alarm clock widget, dictionary widget, and other widgets obtained by the user, as well as user-created widgets;
- widget creator module for making user-created widgets;
- search module;
- video and music player module, which may be made up of a video player module and a music player module;
- notes module;
- map module; and/or
- online video module.

Examples of other applications 936 that may be stored in memory 902 include other word processing applications, other image editing applications, drawing applications, presentation applications, JAVA-enabled applications, encryption, digital rights management, voice recognition, and voice replication.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 902 may store a subset of the modules and data structures identified above. Furthermore, memory 902 may store additional modules and data structures not described above.

In some embodiments, device 900 is a device where operation of a predefined set of functions on the device is performed exclusively through a touch screen and/or a touchpad. By using a touch screen and/or a touchpad as the primary input control device for operation of device 900, the number of physical input control devices (such as push buttons, dials, and the like) on device 900 may be reduced.

The predefined set of functions that may be performed exclusively through a touch screen and/or a touchpad include navigation between user interfaces. In some embodiments, the touchpad, when touched by the user, navigates device 900 to a main, home, or root menu from any user interface that may be displayed on device 900. In such embodiments, the touchpad may be referred to as a "menu button." In some other embodiments, the menu button may be a physical push button or other physical input control device instead of a touchpad.

Figure 10:
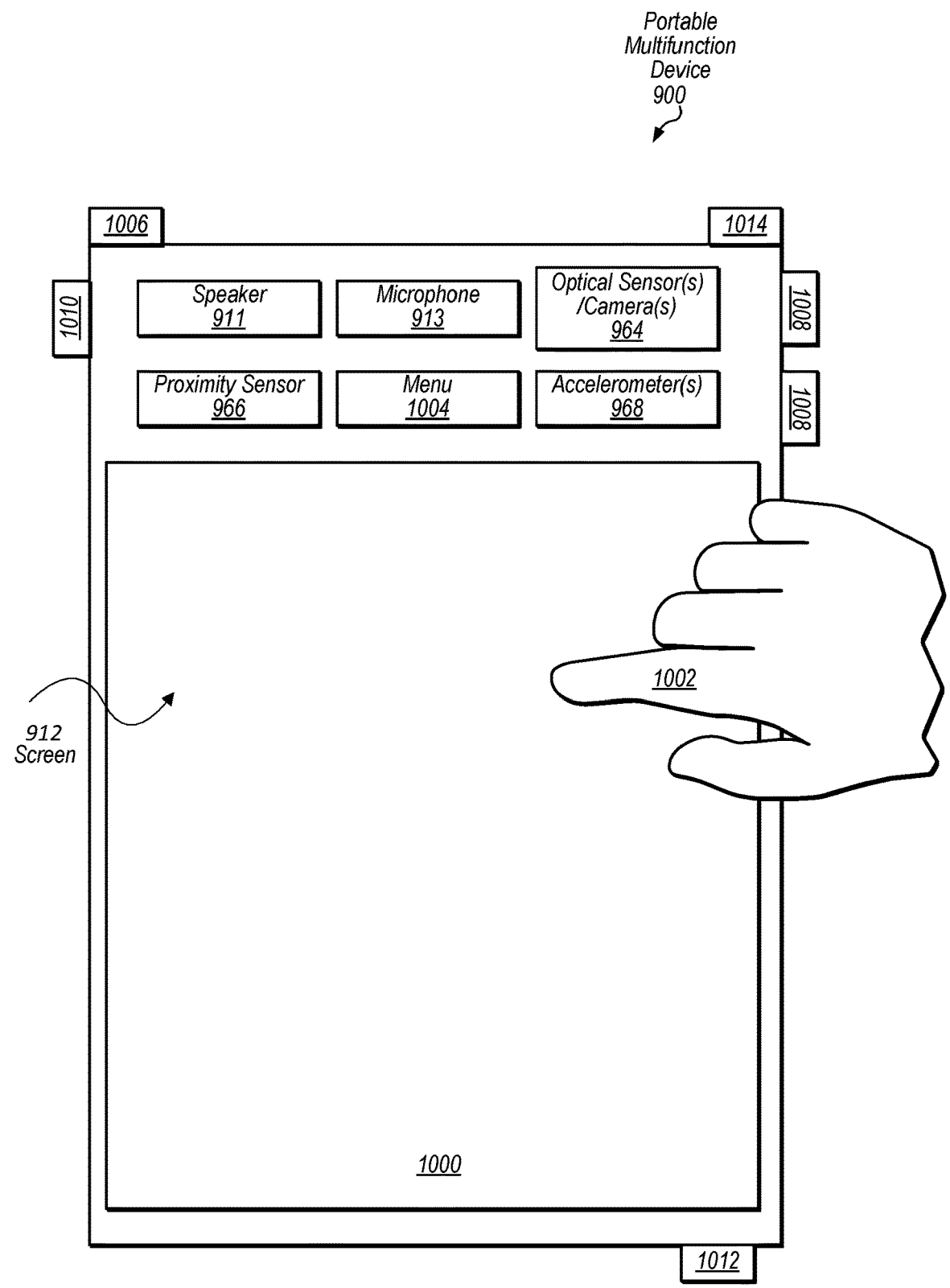
FIG. 10 depicts a portable multifunction device having a camera in accordance with some embodiments.

FIG. 10 illustrates an example portable multifunction device 900 that may include a camera module (e.g., the cameras described above with reference to FIGS. 1-8), in accordance with some embodiments. The device 900 may include a touch screen 912. The touch screen 912 may display one or more graphics within user interface (UI) 1000. In this embodiment, as well as others described below, a user may select one or more of the graphics by making a gesture on the graphics, for example, with one or more fingers 1002 (not drawn to scale in the figure) or one or more styluses (not shown).

Device 900 may also include one or more physical buttons, such as "home" or menu button 1004. As described previously, menu button 1004 may be used to navigate to any application 936 in a set of applications that may be executed on device 900. Alternatively, in some embodiments, the menu button 1004 is implemented as a soft key in a GUI displayed on touch screen 912.

In one embodiment, device 900 includes touch screen 912, menu button 1004, push button 1006 for powering the device on/off and locking the device, volume adjustment button(s) 1008, Subscriber Identity Module (SIM) card slot 1010, head set jack 1012, and docking/charging external port 1014. Push button 1006 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 900 also may accept verbal input for activation or deactivation of some functions through microphone 913.

It should be noted that, although many of the examples herein are given with reference to optical sensor/camera 964 (on the front of a device), a rear-facing camera or optical sensor that is pointed opposite from the display may be used instead of or in addition to an optical sensor/camera 964 on the front of a device.

Example Computer System

Figure 11:
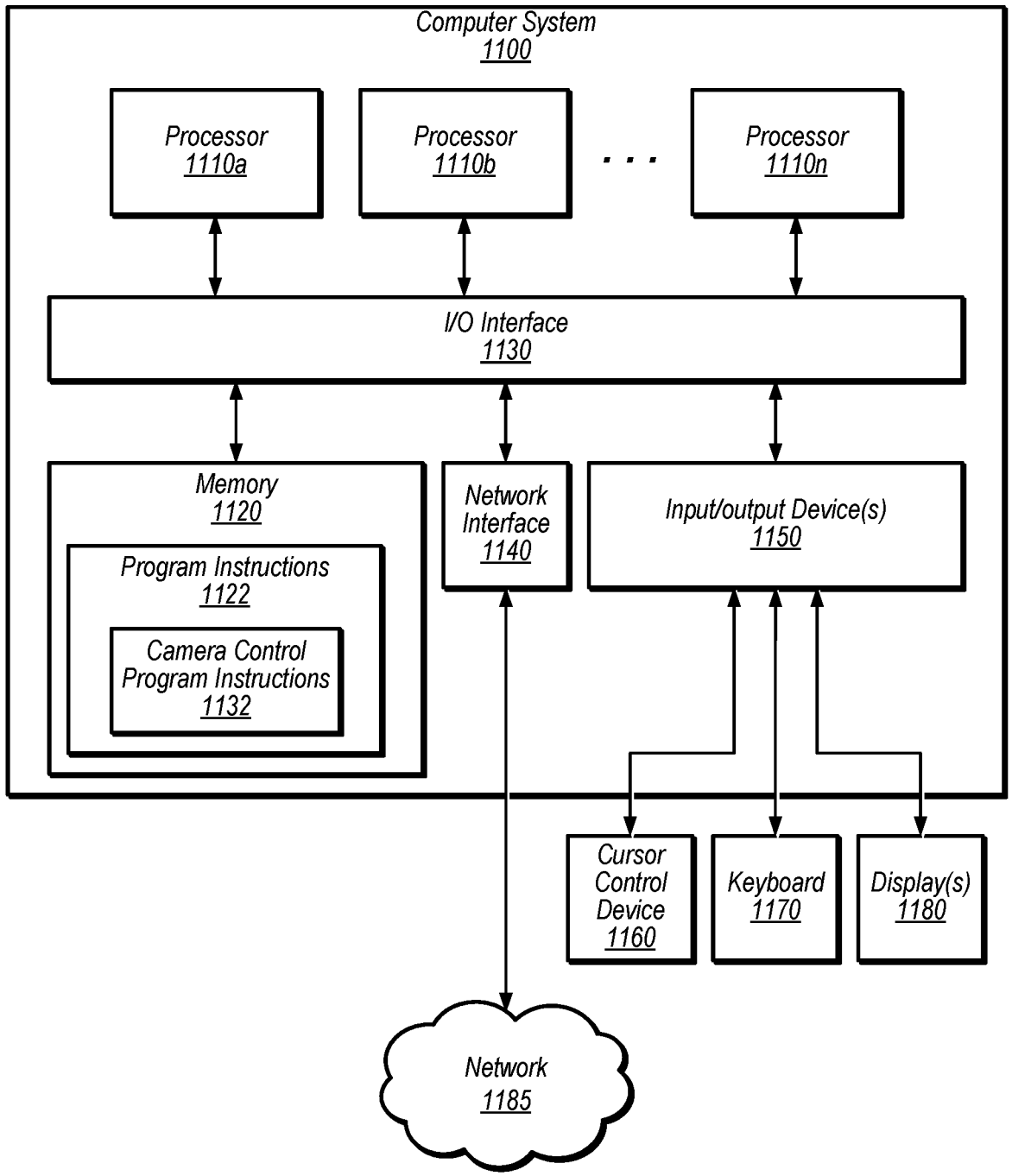
FIG. 11 illustrates an example computer system that may be included in a mobile device, according to some embodiments.

FIG. 11 illustrates an example computer system 1100 that may include a camera module (e.g., the cameras described above with reference to FIGS. 1-8), in accordance with some embodiments. The computer system 1100 may be configured to execute any or all of the embodiments described above. In different embodiments, computer system 1100 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 1100, which may interact with various other devices. Note that any component, action, or functionality described above with respect to FIGS. 1-10 may be implemented on one or more computers configured as computer system 1100 of FIG. 11, according to various embodiments. In the illustrated embodiment, computer system 1100 includes one or more processors 1110 coupled to a system memory 1120 via an input/output (I/O) interface 1130. Computer system 1100 further includes a network interface 1140 coupled to I/O interface 1130, and one or more input/output devices 1150, such as cursor control device 1160, keyboard 1170, and display(s) 1180. In some cases, it is contemplated that embodiments may be implemented using a single instance of computer system 1100, while in other embodiments multiple such systems, or multiple nodes making up computer system 1100, may be configured to host different portions or instances of embodiments. For example, in one embodiment some elements may be implemented via one or more nodes of computer system 1100 that are distinct from those nodes implementing other elements.

In various embodiments, computer system 1100 may be a uniprocessor system including one processor 1110, or a multiprocessor system including several processors 1110 (e.g., two, four, eight, or another suitable number). Processors 1110 may be any suitable processor capable of executing instructions. For example, in various embodiments processors 1110 may be general-purpose or embedded processors implementing any of a variety of instruction set architectures (ISAs), such as the x86, PowerPC, SPARC, or MIPS ISAs, or any other suitable ISA. In multiprocessor systems, each of processors 1110 may commonly, but not necessarily, implement the same ISA.

System memory 1120 may be configured to store camera control program instructions 1122 and/or camera control data accessible by processor 1110. In various embodiments, system memory 1120 may be implemented using any suitable memory technology, such as static random access memory (SRAM), synchronous dynamic RAM (SDRAM), nonvolatile/Flash-type memory, or any other type of memory. In the illustrated embodiment, program instructions 1122 may be configured to implement an image sensor control application incorporating any of the functionality described above. Additionally, existing camera control data 1132 of memory 1120 may include any of the information or data structures described above. In some embodiments, program instructions and/or data may be received, sent or stored upon different types of computer-accessible media or on similar media separate from system memory 1120 or computer system 1100. While computer system 1100 is described as implementing the functionality of functional blocks of previous Figures, any of the functionality described herein may be implemented via such a computer system.

In one embodiment, I/O interface 1130 may be configured to coordinate I/O traffic between processor 1110, system memory 1120, and any peripheral devices in the device, including network interface 1140 or other peripheral interfaces, such as input/output devices 1150. In some embodiments, I/O interface 1130 may perform any necessary protocol, timing or other data transformations to convert data signals from one component (e.g., system memory 1120) into a format suitable for use by another component (e.g., processor 1110). In some embodiments, I/O interface 1130 may include support for devices attached through various types of peripheral buses, such as a variant of the Peripheral Component Interconnect (PCI) bus standard or the Universal Serial Bus (USB) standard, for example. In some embodiments, the function of I/O interface 1130 may be split into two or more separate components, such as a north bridge and a south bridge, for example. Also, in some embodiments some or all of the functionality of I/O interface 1130, such as an interface to system memory 1120, may be incorporated directly into processor 1110.

Network interface 1140 may be configured to allow data to be exchanged between computer system 1100 and other devices attached to a network 1185 (e.g., carrier or agent devices) or between nodes of computer system 1100. Network 1185 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1140 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1150 may, in some embodiments, include one or more display terminals, keyboards, keypads, touchpads, scanning devices, voice or optical recognition devices, or any other devices suitable for entering or accessing data by one or more computer systems 1100. Multiple input/output devices 1150 may be present in computer system 1100 or may be distributed on various nodes of computer system 1100. In some embodiments, similar input/output devices may be separate from computer system 1100 and may interact with one or more nodes of computer system 1100 through a wired or wireless connection, such as over network interface 1140.

As shown in FIG. 11, memory 1120 may include program instructions 1122, which may be processor-executable to implement any element or action described above. In one embodiment, the program instructions may implement the methods described above. In other embodiments, different elements and data may be included. Note that data may include any data or information described above.

Those skilled in the art will appreciate that computer system 1100 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1100 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1100 may be transmitted to computer system 1100 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A mobile device, comprising:
   a mobile device casing;
   an image sensor, positioned in an interior space of the mobile device casing, comprising:
      an image capture portion configured to generate image data based on received light;
      a light source module substantially embedded under an exterior surface of a silicon substrate of the image sensor; and
      a driver for the light source module embedded in the silicon substrate of the image sensor, wherein the light source module is connected to the driver by conductive paths embedded in the silicon substrate between the driver and the light source module;
   an electrical backplane, positioned in the interior space of the mobile device casing, comprising:
      a light sensor configured to detect light emitted from the light source module of the image sensor; and
   one or more actuators configured to move the image sensor within the mobile device casing, wherein said movement comprises movement relative to the electrical backplane,
   wherein the light source module is substantially embedded on a side of the silicon substrate of the image sensor facing the electrical backplane or a side of the silicon substrate of the image sensor perpendicular to the electrical backplane, and
   wherein the light source module is configured to emit light into an open space within the mobile device casing between the image sensor and the electrical backplane to communicate the image data between the image sensor and the electrical backplane.

2. The mobile device of claim 1, wherein the one or more actuators comprise:
   one or more flexures configured to movably support the image sensor above or below the electrical backplane; and
   one or more voice coil motors configured to move the image sensor within the mobile device casing.

3. The mobile device of claim 1, wherein the light source module is a vertical-cavity surface emitting laser (VCSEL) substantially embedded under the exterior surface of the silicon substrate of the image sensor.

4. The mobile device of claim 1, wherein the light source module substantially embedded under the exterior surface of the silicon substrate of the image sensor comprises:
   a bottom metal contact embedded in the silicon substrate of the image sensor, wherein the bottom metal contact is connected to the driver via a first conductive path embedded in the silicon substrate between the bottom metal contact and the driver.

5. The mobile device of claim 4, wherein the light source module substantially embedded under the exterior surface of the silicon substrate of the image sensor further comprises:
   a top metal contact connected to the driver via a second conductive path embedded in the silicon substrate between the top metal contact and the driver.

6. The mobile device of claim 5, wherein the top metal contact extends beyond a surface of the silicon substrate of the image sensor by less than 100 microns.

7. The mobile device of claim 5, wherein the light source module substantially embedded under the exterior surface of the silicon substrate of the image sensor further comprises:
   a lower reflector positioned adjacent to the bottom metal contact;
   an upper reflector positioned adjacent to the top metal contact; and
   a quantum well positioned between the lower reflector and the upper reflector.

8. The mobile device of claim 1, wherein the light sensor is configured to measure a relative position or angle of the image sensor based on light received from the light source module substantially embedded under the exterior surface of the silicon substrate of the image sensor.

9. A camera package, comprising:
   an image sensor, comprising:
      an image capture portion configured to generate image data based on received light;
      a light source module substantially embedded under an exterior surface of a silicon substrate of the image sensor; and
      a driver for the light source module embedded in the silicon substrate of the image sensor, wherein the light source module is connected to the driver by conductive paths embedded in the silicon substrate between the driver and the light source module;
   an electrical backplane, comprising:
      a light sensor configured to detect light emitted from the light source module of the image sensor; and one or more actuators configured to move the image sensor, wherein said movement comprises movement relative to the electrical backplane, wherein the light source module is substantially embedded on a side of the silicon substrate of the image sensor facing the electrical backplane or a side of the silicon substrate of the image sensor perpendicular to the electrical backplane, and wherein the light source module is configured to emit light into an open space between the image sensor and the electrical backplane to communicate the image data between the image sensor and the electrical backplane.

10. The camera package of claim 9, wherein the light source module and associated connections extend beyond an exterior surface of the silicon substrate of the image sensor by less than 100 microns.

11. The camera package of claim 9, further comprising:
one or more additional light source modules embedded in the silicon substrate of the image sensor; and
one or more additional drivers for the one or more additional light source modules, wherein the one or more additional light source modules are connected to respective ones of the one or more additional drivers via respective conductive paths embedded in the silicon substrate between the respective one or more additional drivers and the respective one or more additional light source modules,
wherein the one or more additional light source modules are configured to emit light into the open space between the image sensor and the electrical backplane to communicate the image data between the image sensor and the electrical backplane.

12. The camera package of claim 11, further comprising:
an aggregation component embedded in the silicon substrate of the image sensor, wherein the aggregation component is configured to aggregate the image data and distribute the image data to the driver and the one or more additional drivers.

13. The camera package of claim 12, wherein respective ones of the light source modules are configured to communicate portions of the image data between the image sensor and the electrical backplane in parallel with at least one other one of the light source modules.

14. The camera package of claim 9, wherein the light source module substantially embedded under the exterior surface of the silicon substrate of the image sensor comprises:
a top metal contact connected to the driver via a second conductive path embedded in the silicon substrate of the image sensor between the top metal contact and the driver.

15. The camera package of claim 14, wherein the light source module substantially embedded under the exterior surface of the silicon substrate of the image sensor further comprises:
a bottom metal contact embedded in the silicon substrate of the image sensor, wherein the bottom metal contact is connected to the driver via a first conductive path embedded in the silicon substrate of the image sensor between the bottom metal contact and the driver.

16. The camera package of claim 15, wherein the light source module substantially embedded under the exterior surface of the silicon substrate of the image sensor further comprises:
a lower reflector positioned adjacent to the bottom metal contact;
an upper reflector positioned adjacent to the top metal contact; and
a quantum well positioned between the lower reflector and the upper reflector.

17. An image sensor assembly, comprising:
an image capture portion configured to generate image data based on received light;
a light source module substantially embedded under an exterior surface of a silicon substrate of the image sensor;
a driver for the light source module embedded in the silicon substrate of the image sensor, wherein the light source module is connected to the driver by conductive paths embedded in the silicon substrate between the driver and the light source module; and
an actuator coupled to the image sensor, wherein the actuator is configured to cause movement of the image sensor relative to an electrical backplane,
wherein the light source module is substantially embedded on a side of the silicon substrate of the image sensor facing the electrical backplane or a side of the silicon substrate of the image sensor perpendicular to the electrical backplane, and
wherein the light source module is configured to emit light into an open space between the image sensor and the electrical backplane to communicate the image data between the image sensor and the electrical backplane.

18. The image sensor assembly of claim 17, wherein the light source module substantially embedded under the exterior surface of the silicon substrate of the image sensor comprises:
a bottom metal contact embedded in the silicon substrate of the image sensor, wherein the bottom metal contact is connected to the driver via a first conductive path embedded in the silicon substrate of the image sensor between the bottom metal contact and the driver.

19. The image sensor assembly of claim 18, wherein the light source module substantially embedded under the exterior surface of the silicon substrate of the image sensor further comprises:
a top metal contact connected to the driver via a second conductive path embedded in the silicon substrate of the image sensor between the top metal contact and the driver.

20. The image sensor assembly of claim 19, wherein the top metal contact extends beyond a surface of the silicon substrate of the image sensor by no more than 100 microns.

* * * * *